(12) United States Patent
Huber et al.

(10) Patent No.: US 12,087,394 B2
(45) Date of Patent: Sep. 10, 2024

(54) SYNCHRONOUS INPUT BUFFER CONTROL USING A RIPPLE COUNTER

(71) Applicant: Micron Technology, Inc., Boise, ID (US)

(72) Inventors: Brian W. Huber, Allen, TX (US); Scott E. Smith, Plano, TX (US); Gary L. Howe, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 187 days.

(21) Appl. No.: 17/930,655

(22) Filed: Sep. 8, 2022

(65) Prior Publication Data
US 2024/0087621 A1    Mar. 14, 2024

(51) Int. Cl.
*G11C 7/10* (2006.01)

(52) U.S. Cl.
CPC ............ *G11C 7/1084* (2013.01); *G11C 7/109* (2013.01); *G11C 7/1093* (2013.01); *G11C 7/1096* (2013.01)

(58) Field of Classification Search
CPC ..... G11C 7/1084; G11C 7/109; G11C 7/1093; G11C 7/1096; G11C 7/02; G11C 7/20; G11C 11/4072; G11C 11/4076; G11C 7/222; G11C 7/225
See application file for complete search history.

(56) References Cited

U.S. PATENT DOCUMENTS

| | | | | | |
|---|---|---|---|---|---|
| 4,755,969 A | * | 7/1988 | Pappas | ..................... | G06F 7/584 326/46 |
| 4,875,196 A | * | 10/1989 | Spaderna | ................. | G11C 8/16 365/189.04 |
| 5,982,700 A | * | 11/1999 | Proebsting | ............... | G11C 8/16 711/149 |

* cited by examiner

*Primary Examiner* — Ajay Ojha
(74) *Attorney, Agent, or Firm* — Fletcher Yoder, P.C.

(57) ABSTRACT

A memory device includes a command interface configured to receive write commands from a host device. Additionally, the memory device includes an input buffer configured to buffer a strobe signal from the host device. Furthermore, the memory device includes a first ripple counter and a second ripple counter. The memory device includes command handling circuitry configured to alternatingly start the first ripple counter and the second ripple counter in response to consecutive write commands. The command handling circuitry and/or the first and second ripple counters are configured to suppress a reset of the input buffer if either the first ripple counter or the second ripple counter has not reached a threshold and is still counting.

24 Claims, 5 Drawing Sheets

SYNCHRONOUS INPUT BUFFER CONTROL USING A RIPPLE COUNTER

BACKGROUND

Field of the Present Disclosure

Embodiments of the present disclosure relate generally to memory devices. More specifically, embodiments of the present disclosure relate to enabling and disabling an input buffer of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor.

The host device (e.g., processor) may send data and commands to the memory devices. The memory devices utilize input buffers to capture input data received from the host device. These input buffers may be selectively disabled and enabled using input buffer enable signals. For instance, a data strobe (DQS) input buffer is used to buffer the DQS received from the host device that is used to assist in capturing data received from the host device. The DQS may also be divided into 4 phases using a DQS clock generator. A data (DQ) input buffer may be used to buffer data from the host device. At the conclusion of a write command, the data input buffer may be disabled to save power when there is a relatively large separation (e.g., minimum separation of 25 tCKs) between write commands. During this input buffer disable period, the DQS clock generator will reset to synchronize the state of the DQS clocks for the next incoming write. It is possible that at certain write-to-write timings, this input buffer disable period may be too short to properly reset the DQS clock generator in all operating conditions and may result in a partial reset condition. This partial reset of the DQS clock generator may be related to asynchronous behavior of the input buffer enable circuitry that causes a failure (e.g., a sliver fail) in the memory device with the data input buffer dropping the first data bits of the second write command after the truncated input buffer disable.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, truncated input buffer disable periods may cause memory failures where a portion of input bits are dropped due to a partial reset of a four-phase DQS clock generator. To address this failure, input buffer control circuitry may implement an at least partially synchronous solution for enabling and disabling the data and DQS input buffers to ensure that the data input buffer enable behavior is deterministic and to ensure that the data and DQS input buffers have sufficient reset pulse durations. For instance, the input buffer control circuitry may utilize two (or more) ripple counters to implement a minimum width for a reset pulse width. For each write command, one of the counters begins counting a duration (e.g., column address strobe (CAS) latency (CL)+3 tCKs or CAS write latency (CWL)+5 tCKs). After the duration in the ripple counter has been reached, the input buffer may be disabled/reset if the other counter has not started a subsequent counting based on a subsequent write command. For instance, to achieve the CL+3, 2's complement may be used to set the start point for a rollover (e.g., all bits in counter to zero) as a reset of a 4 phase clock generator. The control circuitry may skip the add one step of 2's complement using a simplified circuit requiring 1 more count (i.e., 1 more tCK) to reach the rollover. A first half-frequency count may be skipped also adding 2 tCK. Thus, using the simplified circuit and the skip of the first half-frequency count adds a total of 3 tCK to naturally add 3 tCK to the CL. Furthermore, although the reset may be tied to the CL (rather than CWL) in some embodiments, the reset may still only respond to write commands since read commands do not create the aforementioned issue regarding the DQS IB.

Figure 1:
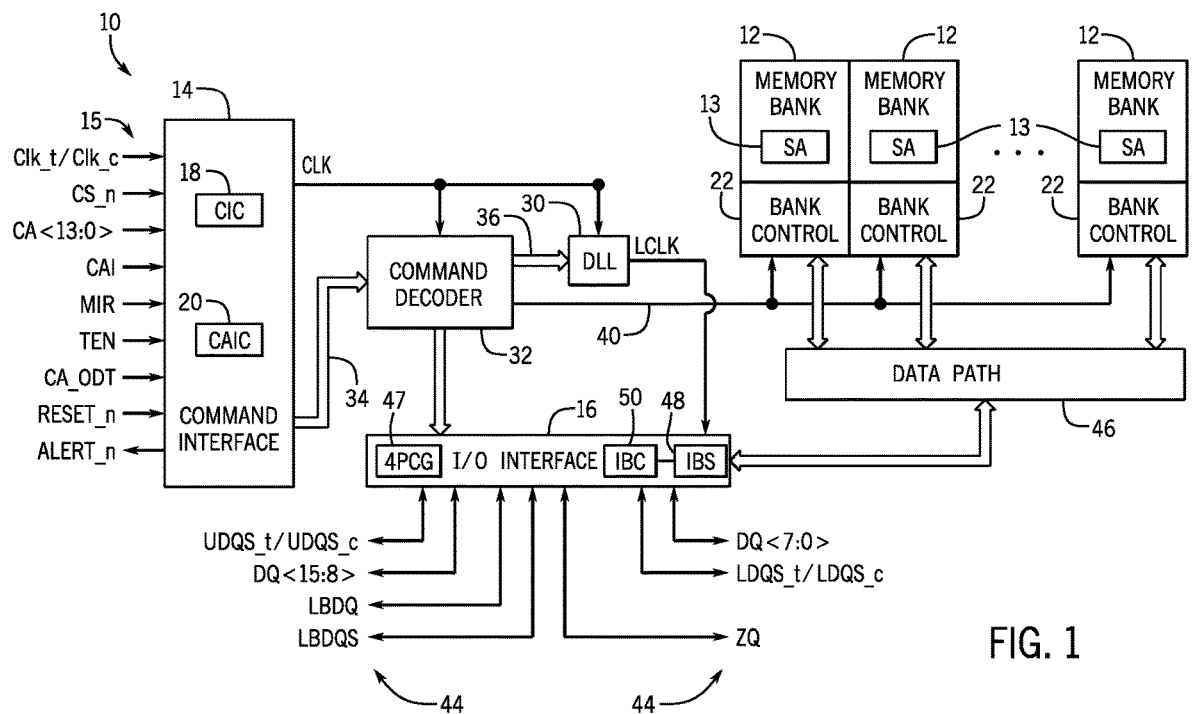
FIG. 1 is a simplified block diagram illustrating certain features of a memory device having input buffers and input buffer control circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 22 include sense amplifiers 13. As previously noted, sense amplifiers 13 are used by the memory device 10 during read operations. Specifically, read circuitry of the memory device 10 utilizes the sense amplifiers 13 to receive low voltage (e.g., low differential) signals from the memory cells of the memory banks 12 and amplifies the small voltage differences to enable the memory device 10 to interpret the data properly.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar clock signal Clk_c. The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the bar clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS may be divided into multiple (e.g., 4 phases) using a 4-phase clock generator (4PCG) 47 that may output successive pulses of the DQS to different clocks to generate different phases. Furthermore, the DQ and DQS signals may be buffered in the memory device 10 using respective input buffers (IBs) 48. Input buffer control circuitry (IBC) 50 may enable and disable the input buffers 48. However, as previously noted, some input buffer disable periods that are shorter than a certain width (e.g., 1-4 tCKs) may cause the 4PCG 47 to be partially reset which may induce the input buffer(s) 48 (e.g., data input buffer) to fail to buffer/drop at least some data bits transmitted via the DQ signals. Thus, as discussed below, the input buffer control circuitry 50 may enforce a minimum write-to-write before disabling the input buffer and enforce a minimum pulse width of input buffer disable periods when disables occur to ensure the full or proper reset of the 4PCG 47.

As discussed below, the IBC 50 may create a reset pulse width that never falls below a minimum width to prevent the aforementioned failures. Furthermore, the IBC 50 may include two (or more) ripple counters that are at least partially synchronous with a system clock of the memory device 10. For instance, a least significant bit may be synchronous while other bits may not necessarily be synchronous. Successive write commands may alternately start the respective counters. Using more than one counter ensures a reset in cases occurring near the reset boundary with another write command coming subsequently. Using the two or more counters, when a new write command occurs prior to the reset target, the counter may be stopped before reaching the reset target and passing the control of the reset to the other counter. To implement such controls, the IBC 50 may include command handling circuitry.

The counters may count a number of cycles, such as CL+3 as a reset point. For instance, the counters may use 2's complement for a start point to support a rollover to a certain value (e.g., all bits being 0) as a reset point of the 4PCG 47. However, the IBC 50 may use a simplified circuit that skips the addition of 1 that is a part of 2's complement algorithms. This simplification causes one more cycle (1 tCK) of count before rolling over. Additionally, the count may be stretched further (e.g., 2 tCK) by skipping the first half-frequency count to ensure reliable start but also giving a total of CL+3 tCKs before a reset.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device 10 as being a DDR5 device, the memory device 10 may be any suitable device (e.g., a double data rate type 4 DRAM (DDR4), a ferroelectric RAM device, or a combination of different types of memory devices).

Figure 2:
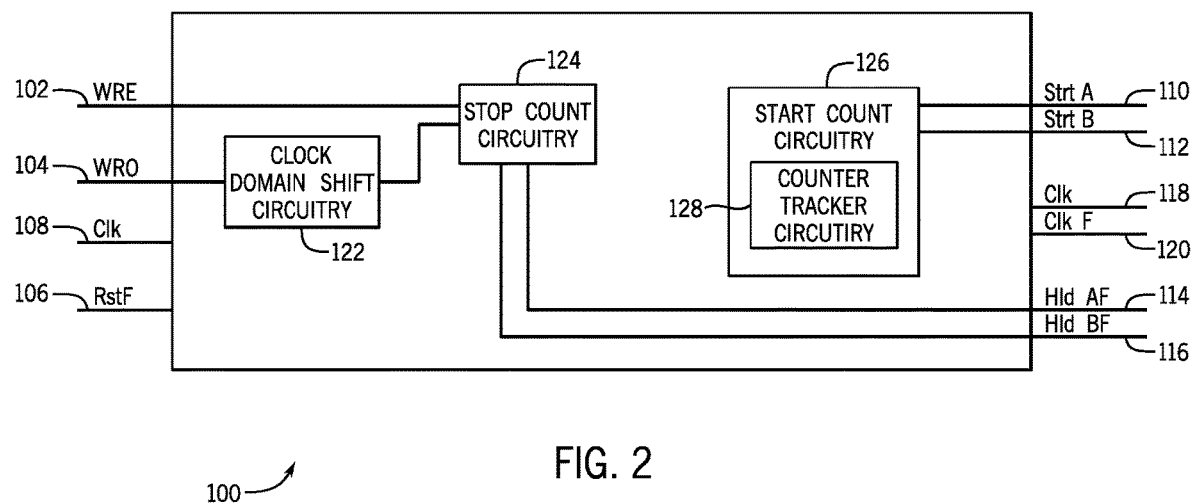
FIG. 2 is a block diagram of an embodiment of command handling circuitry of the input buffer control circuitry of FIG. 1, according to an embodiment of the present disclosure.

FIG. 2 is a circuit diagram of command handling circuitry 100 of the IBC 50 used to control which counter is to be used and to stop toggling of a counter when another counter is started. Specifically, the command handling circuitry 100 may receive even write commands (WRE) 102 and odd write commands (WRO) 104. The command handling circuitry 100 may also receive a reset signal (RstF) 106 and a clock (Clk) 108.

Since write commands in the WRE 102 and the WRO 104 are treated the same with the separate pipelines both monitored by the command handling circuitry 100, the two pipelines may be collapsed for the purposes of command handling. Accordingly, both the WRE 102 and the WRO 104 may be shifted into a common domain (e.g., the WRO 104 shifted to the WRE 102 domain or vice versa) using clock domain shift circuitry 122.

The command handling circuitry 100 may also include stop count circuitry 124 that generates HldAF signal 114 and HldBF signal 116 to control whether counting in a respective counter is to stop based on another subsequent write being received (e.g., either corresponding to the other pipeline or the same pipeline). In other words, the command handling circuitry 100 may send the hold signals HldAF 114 and HldBF 116 to control whether the counting in the respective counters is allowed to proceed to the respective reset points. In some embodiments, the command staying in its own domain may be shifted in the stop count circuitry 124 for count stop synchronism and to keep count stoppage accurate between all cases (e.g., the WRO 104 to the WRE 102, the WRO 104 to the WRO 104, the WRE 102 to the WRE 102, and the WRE 102 to the WRO 104 in consecutive write commands).

The command handling circuitry 100 may include start count circuitry 126 that is configured to alternatingly start the respective counters in response to write commands. To maintain the alternating starts of the counters, the command handling circuitry 100 includes counter tracking circuitry 128 that tracks which counter was last used and uses the other counter for a next command (whether the WRE 102 or the WRO 104). For instance, in an embodiment, the counter tracking circuitry 128 tracking two counters may be implemented as a flip-flop with its complementary output tied to its input and an indication of a received write command as its clock input. Thus, with every write command, the output alternates between a first value (e.g., 0) that corresponds to the first counter and a second value (e.g., 1) that corresponds to the second counter. Based on which counter was used last, the command handling circuitry 100 may assert a first start signal (StrtA) 110 or a second start signal (StrtB) 112. For instance, if the first counter corresponding to the StrtA 110 was used last, the command handling circuitry 100 may assert the StrtB 112 to cause a second counter to start. The command handling circuitry 100 may also provide complementary clocks (Clk and ClkF) 118 and 120 to the counters to enable synchronicity of a first stage of the counters with the command handling circuitry 100 and/or the rest of the memory device 10.

Figure 3:
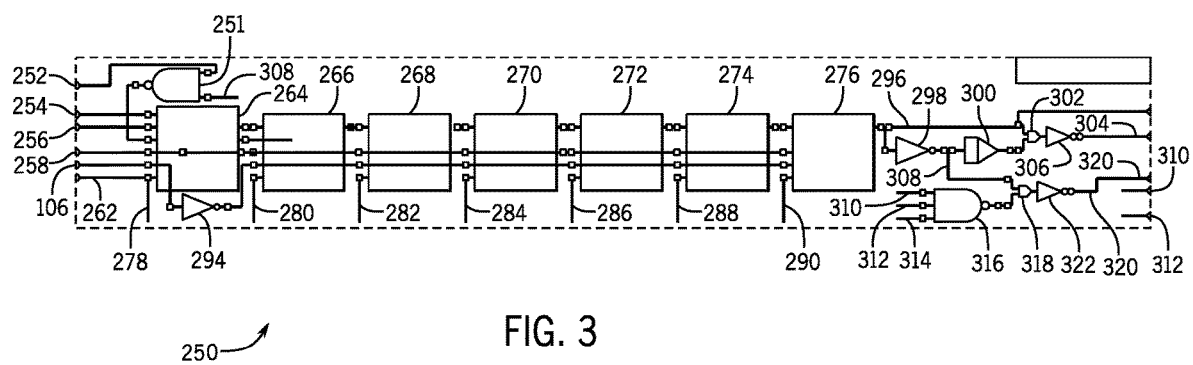
FIG. 3 is a schematic diagram of an embodiment of ripple counters controlled using the input buffer control circuitry of FIG. 2, according to an embodiment of the present disclosure.

FIG. 3 is a circuit diagram of a ripple counter 250. As previously noted, more than one ripple counter is implemented in the memory device 10. For instance, the memory device 10 may include two instantiations of the ripple counter 250. In some embodiments, other counters may be used (e.g., synchronous counters). However, the ripple counter 250 may be used for simplicity with a least significant bit of the ripple counter 250 being synchronous. The delay inherent in more significant bits of the ripple counter 250 may be similar to/designed like the delay from internal circuitry of the memory device 10 to the DQS input buffer. Using the least significant bit's synchronous implementation, the IB 48 may be frequency independent because CL changes with the frequency point increasing to match up with the array, which is the slow point of DRAM-based memory devices.

The ripple counter 250 receives a hold signal (HldF) 252 that is either of the hold signals HldAF 114 and HldBF 116 depending on which counter is the ripple counter 250 while another instantiation would receive the other hold signal. The hold signal 252 is transmitted to a NAND gate 251 along with a BCpre signal 308 to control whether to stop the counter if a new write command has been received at the other counter or if the ripple counter 250 has rolled over. The ripple counter 250 also receives a count signal (Cnt) 256 that may be synchronous/derived from a clock (e.g., a full frequency system clock or a half frequency pipeline clock) of the memory device 10. A complementary count signal (CntF) 254 may also be used. The ripple counter 250 also receives a start signal (Strt) 258 that is either the StrtA 110 or the StrtB 112 from the command handling circuitry 100 that is used to start counting in the ripple counter 250. Also, the ripple counter 250 may be reset using the reset signal 106. The ripple counter 250 may also be loaded with a start value 262 that is used as a starting point for each count. As previously noted, this start value 262 may be determined using a 2's complement algorithm without the plus one addition (i.e., 1's complement). The illustrated ripple counter 250 includes 6 flip-flops 264, 266, 268, 270, 272, 274, and 276 (collectively referred to as flip-flops 264-276) to implement a 6-bit counter with up to CL 64 (full system frequency for the Cnt 256) or CL 128 (half system frequency for the Cnt 256 with divided clock with two pipelines). The flip-flops may be loaded with a respective bit of the start value 262 before counting. For instance, the flip-flop 264 may be loaded with a StrtVal<1> 278 using a set pin of the flip-flop 264. Similarly, the flip-flop 266 may be loaded with a StrtVal<2> 280 using a set pin of the flip-flop 266, and the flip-flop 268 may be loaded with a StrtVal<3> 282 using a set pin of the flip-flop 268. Likewise, the flip-flop 270 may be loaded with a StrtVal<4> 284 using a set pin of the flip-flop 270, the flip-flop 272 may be loaded with a StrtVal<5> 286 using a set pin of the flip-flop 272, and the flip-flop 274 may be loaded with a StrtVal<6> 288 using a set pin of the flip-flop 274. Additionally or alternatively, the start value of a flip-flop (e.g., flip-flop 276) may be set using a voltage 290 via a respective set pin. The reset pins of the flip-flops 264-276 may be reset using the same reset signal 106 and/or may use complementary signals using an inverter 294.

As the count propagates through the ripple counter 250, flip-flops corresponding to less significant bits cause flip-flops of more significant bits to toggle until the output (BCF) 296 of the flip-flop 276 rolls over. BCF 296 is also inverted in an inverter 298 and transmitted through a delay 300. The delayed and inverted BCF is transmitted to a NAND gate 302 along with the undelayed and uninverted BCF 296 to output a pulse on a reset signal (e.g., Dst4PhRst) 304 to reset the 4PCG 47. The duration of the delay controls the width of the pulse and the inverter 298, the delay 300, and the NAND gate 302 act as a pulse generator for the reset signal 304.

The output of the inverter 298 is the BCpre signal 308 that changes when a rollover occurs. A BCoF signal 310, an enable start (enSt) signal 312, and a HldOut signal 314 are transmitted to a NAND gate 316. The BCoF signal 310 is received from the other counter, and the enSt signal 312 are received from the command handling circuitry 100. The BCoF signal 308 is an active low version of the other counter's highest order bit. So, it will be a 1 when the counter has rolled over to 0s (e.g., reached its completion, such as CL+3). The HldOut signal 314 is a locally latched active version of the output of NAND 251 where its output can be held in an active hold state due to the new command or due to a rollover. The HldOut signal 314 can be reset using an assertion of the Strt signal 258. An assertion of the enSt signal 312 enables the respective ripple counter 250 to receive the next command start. The output of the NAND gate 316 is transmitted to a NAND gate 318 along with the BCpre signal 308. The output of the NAND gate 318 is used to generate a BC signal 320 using an inverter 322. The BC signal 320 is the active high version of its counter's highest order bit and will be 0 when the counter has rolled over to 0s (e.g., reached its completion, such as CL+3).

Figure 4:
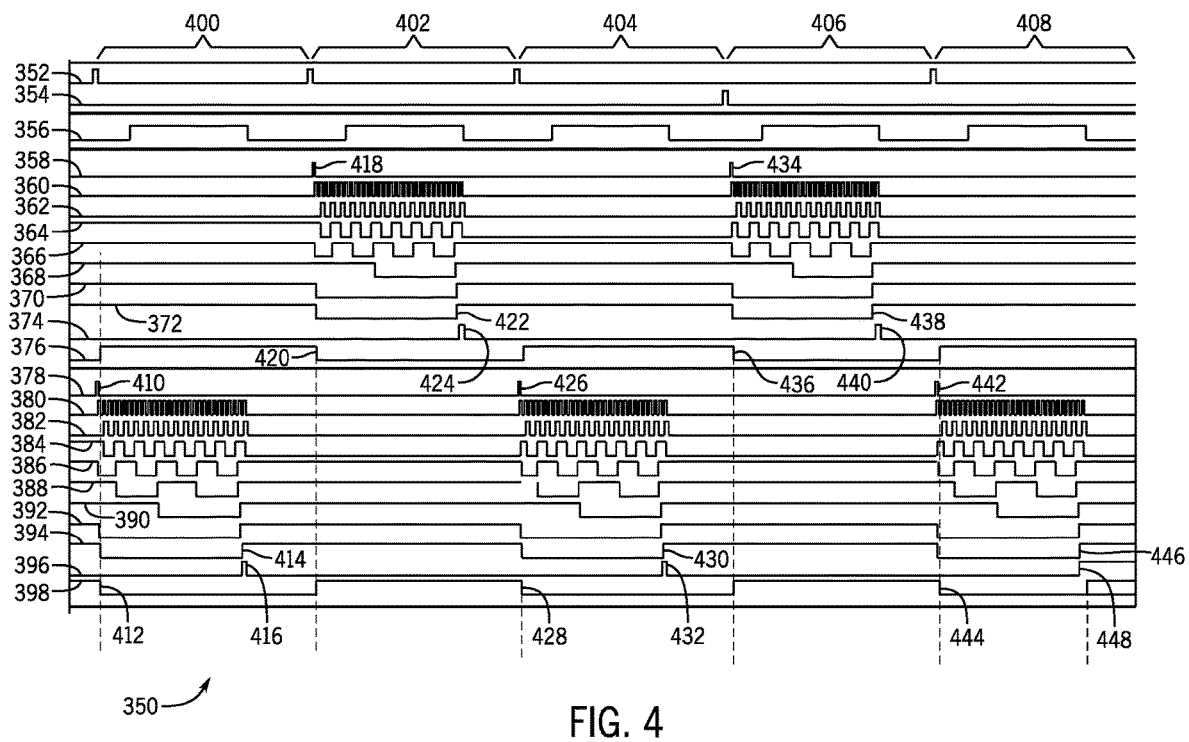
FIG. 4 is a graph of a timing diagram of operation using the circuitry of FIGS. 2 and 3 when receiving consecutive write commands via the command interface of FIG. 1, according to an embodiment of the present disclosure.

FIG. 4 is a graph showing an embodiment of a timing diagram 350 for using two copies of the ripple counter 250 and an embodiment of the command handling circuitry 100. The timing diagram 350 includes lines 352 and 354 each corresponding to write command inputs (e.g., WRE 102 and WRO 104). The timing diagram 350 also includes a line 356 indicative of an enable of the IB 48, where a low value indicates a reset or disablement of the IB 48.

The timing diagram 350 also includes a line 358 corresponding to Strt A 110 (or Strt 258) of a first ripple counter 250 of two ripple counters. Furthermore, the timing diagram 350 includes lines 360, 362, 364, 366, 368, and 370 corresponding to respective outputs of the flip-flops 266-276 of the first ripple counter 250. A line 372 corresponds to BCF 296 of the first ripple counter 250, and a line 374 corresponds to the reset pulse 304 of the first ripple counter 250. Additionally, a line 376 corresponds to an enSt signal 312 (e.g., enStA) for the first ripple counter 250.

The timing diagram 350 also includes a line 378 corresponding to the strtB 112 (or Strt 258) of a second ripple counter 250 of the two ripple counters. Furthermore, the timing diagram 350 includes lines 380, 382, 384, 386, 388, and 390 corresponding to respective outputs of the flip-flops 266-276 of the second ripple counter 250. A line 392 corresponds to BCF 296 of the second ripple counter 250, and a line 394 corresponds to the reset pulse 304 of the second ripple counter 250. Additionally, a line 398 corresponds to an enSt signal 312 (e.g., enStB) for the second ripple counter 250.

The timing diagram 350 shows durations 400, 402, 404, 406, and 408 between pulses of the lines 352 and 354. As illustrated, the durations all exceed a minimum number of tCKs (e.g., 33 tCK=CL+3 tCKs) for resets of the IB 48 as illustrated by the toggling of the line 356 after each pulse of the lines 352 and 354. Specifically, counting is started in the second ripple counter 250 when a pulse 410 occurs on the line 378. This start of counting also causes the lines 376 and 398 to toggle at time 412. The toggling propagates through the flip-flops 266-276 of the second ripple counter 250 until the BCF 296 of the second ripple counter 250 toggles as indicated by rising edge 414 and the reset signal pulse 416.

Counting is started in the first ripple counter 250 when a pulse 418 occurs on the line 358. This start of counting also causes the lines 376 and 398 to toggle at time 420. The toggling propagates through the flip-flops 266-276 of the first ripple counter 250 until the BCF 296 of the first ripple counter 250 toggles as indicated by rising edge 422 and the reset signal pulse 424.

Counting is again started in the second ripple counter 250 when a pulse 426 occurs on the line 378. This start of counting also causes the lines 376 and 398 to toggle at time 428. The toggling propagates through the flip-flops 266-276 of the second ripple counter 250 until the BCF 296 of the second ripple counter 250 toggles as indicated by rising edge 430 and the reset signal pulse 432.

Counting is started again in the first ripple counter 250 when a pulse 434 occurs on the line 358. This start of counting also causes the lines 376 and 398 to toggle at time 436. The toggling propagates through the flip-flops 266-276 of the first ripple counter 250 until the BCF 296 of the first ripple counter 250 toggles as indicated by rising edge 438 and the reset signal pulse 440.

Counting is finally started a last time in the second ripple counter 250 when a pulse 442 occurs on the line 378. This start of counting also causes the lines 376 and 398 to toggle at time 444. The toggling propagates through the flip-flops 266-276 of the second ripple counter 250 until the BCF 296 of the second ripple counter 250 toggles as indicated by rising edge 446 and the reset signal pulse 448.

Figure 5:
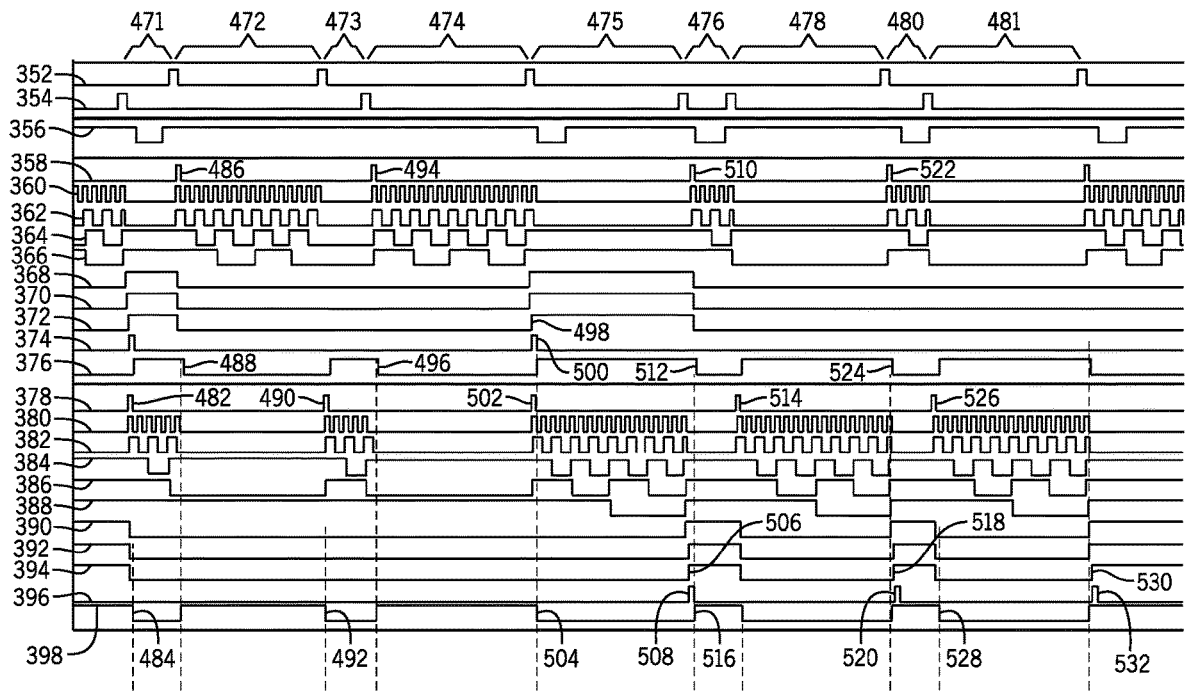
FIG. 5 is a graph of a timing diagram of operation using the circuitry of FIGS. 2 and 3 when receiving consecutive write commands via the command interface of FIG. 1, according to an embodiment of the present disclosure.

FIG. 5 is a graph of a timing diagram 470 that includes the same lines as the timing diagram 350 of FIG. 4 except with different durations between write commands. Specifically, the timing diagram 470 includes durations 471, 472, 473, 474, 475, 476, 477, 478, 480, and 481, where duration 474 (e.g., 35 tCK) exceeds the minimum and durations 475, 478, and 481 are all the minimum duration (e.g., 33 tCKs). The durations 471, 472, 473, 476, and 480 are all below the minimum (e.g., <33 tCKs) with no resets of the IB 48.

Counting is started in the second ripple counter 250 when a pulse 482 occurs on the line 378. This start of counting also causes the lines 376 and 398 to toggle at time 484. The toggling propagates through the flip-flops 266-276 of the second ripple counter 250 but stops before the BCF 296 of the second ripple counter 250 toggles due to the write corresponding to pulse 486 due to the duration 471 being less than the minimum width for a reset.

Counting is started in the first ripple counter 250 when the pulse 486 occurs on the line 358 (while also stopping the counting in the second ripple counter 250). This start of counting also causes the lines 376 and 398 to toggle at time 488. The toggling propagates through the flip-flops 266-276 of the first ripple counter 250 but stops before the BCF 296 of the second ripple counter 250 toggles due to the write corresponding to pulse 490 due to the duration 472 being less (e.g., 32 tCK) than the minimum width (e.g., 33 tCK) for a reset.

Counting is started in the second ripple counter 250 by the pulse 490 occurs on the line 378 (while stopping the counting in the first ripple counter 250). This start of counting also causes the lines 376 and 398 to toggle at time 492. The toggling propagates through the flip-flops 266-276 of the second ripple counter 250 but stops before the BCF 296 of the second ripple counter 250 toggles due to the write corresponding to pulse 494 due to the duration 473 being less than the minimum width for a reset.

Counting is started in the first ripple counter 250 when the pulse 494 occurs on the line 358 (while also stopping the counting in the second ripple counter 250). This start of counting also causes the lines 376 and 398 to toggle at time 496. The toggling propagates through the flip-flops 266-276 of the first ripple counter 250 until the BCF 296 of the second ripple counter 250 toggles as indicated by rising edge 498 and reset pulse 500 since the duration 474 meets or exceeds the minimum duration for a reset.

Counting is again started in the second ripple counter 250 when a pulse 502 occurs on the line 378. This start of counting also causes the lines 376 and 398 to toggle at time 504. The toggling propagates through the flip-flops 266-276 of the second ripple counter 250 until the BCF 296 of the second ripple counter 250 toggles as indicated by the rising edge 506 and reset pulse 508 since the duration 475 meets or exceeds the minimum duration for a reset.

Counting is yet again started in the first ripple counter 250 when pulse 510 occurs on the line 358. This start of counting also causes the lines 376 and 398 to toggle at time 512. The toggling propagates through the flip-flops 266-276 of the first ripple counter 250 but stops before the BCF 296 of the second ripple counter 250 toggles due to the write corresponding to pulse 514 due to the duration 476 being less than the minimum width for a reset.

Counting is started in the second ripple counter 250 when the pulse 514 occurs on the line 378. This start of counting also causes the lines 376 and 398 to toggle at time 516. The toggling propagates through the flip-flops 266-276 of the second ripple counter 250 until the BCF 296 of the second ripple counter 250 toggles as indicated by the rising edge 518 and reset pulse 520 since the duration 478 meets or exceeds the minimum duration for a reset.

Counting is started in the first ripple counter 250 when pulse 522 occurs on the line 358. This start of counting also causes the lines 376 and 398 to toggle at time 524. The toggling propagates through the flip-flops 266-276 of the first ripple counter 250 but stops before the BCF 296 of the second ripple counter 250 toggles due to the write corresponding to pulse 526 due to the duration 480 being less than the minimum width for a reset.

Counting is started in the second ripple counter 250 when the pulse 526 occurs on the line 378. This start of counting also causes the lines 376 and 398 to toggle at time 528. The toggling propagates through the flip-flops 266-276 of the second ripple counter 250 until the BCF 296 of the second ripple counter 250 toggles as indicated by the rising edge 530 and reset pulse 532 since the duration 481 meets or exceeds the minimum duration for a reset.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:
a command interface configured to receive write commands from a host device;
an input buffer configured to buffer a strobe signal from the host device;
a first ripple counter;
a second ripple counter; and
command handling circuitry configured to alternatingly start the first ripple counter and the second ripple counter in response to consecutive write commands and to suppress a reset of the input buffer if either the first ripple counter or the second ripple counter has not reached a threshold and is counting.

2. The memory device of claim 1, wherein the threshold comprises a rollover of the first ripple counter or the second ripple counter.

3. The memory device of claim 2, wherein start points of the first ripple counter and the second ripple counter are based at least in part on a 2's complement.

4. The memory device of claim 1, wherein the first ripple counter and the second ripple counter both comprise a first stage that is synchronous with a system clock of the memory device.

5. The memory device of claim 1, wherein the command interface comprises two pipelines with divided clocks, wherein the two pipelines alternatingly receive write commands from the host device, and the command handling circuitry comprises clock domain shift circuitry to shift from a first clock domain of a first pipeline of the two pipelines to a second clock domain of a second pipeline of the two pipelines.

6. The memory device of claim 5, wherein the command handling circuitry comprises a stop count circuitry configured to shift a write command of the second pipeline.

7. The memory device of claim 5, wherein the command handling circuitry comprises a stop count circuitry configured to stop counting in the first ripple counter corresponding to the first pipeline when a first subsequent write command is received in the second pipeline before the threshold is reached in the first ripple counter.

8. The memory device of claim 7, wherein the stop count circuitry is configured to stop counting in the second ripple counter corresponding to the second pipeline when a second subsequent write command is received in the first pipeline before the threshold is reached in the second ripple counter.

9. The memory device of claim 1, wherein the command handling circuitry comprises start count circuitry configured to start counting in the first ripple counter and in the second ripple counter based on received respective write commands.

10. The memory device of claim 9, wherein the start count circuitry comprises counter tracking circuitry.

11. The memory device of claim 10, wherein the counter tracking circuitry comprises a flip-flop with an input terminal of the flip-flop connected to a complementary output of the flip-flop.

12. The memory device of claim 11, wherein an output of the flip-flop alternates between a first value and a second value with each received write command, the first value corresponds to a launch of the first ripple counter, and the second value corresponds to a launch of the second ripple counter.

13. A method for operating a memory device, comprising:
receiving, at a command interface of the memory device, a first write command;
transmitting a first indication of the first write command from the command interface to a command handling circuitry;
in response to the first indication of the first write command being received at the command handling circuitry, asserting a first start signal to start a first ripple counter;
blocking an input buffer of the memory device from being reset while the first ripple counter is counting;
receiving, at the command interface of the memory device, a second write command;
transmitting a second indication of the second write command from the command interface to the command handling circuitry;
in response to the second indication of the second write command being received at the command handling circuitry, asserting a second start signal to start a second ripple counter; and
blocking the input buffer of the memory device from being reset while the second ripple counter is counting.

14. The method of claim 13, comprising stopping the first ripple counter when the second indication is received while the first ripple counter is counting.

15. The method of claim 14, wherein stop count circuitry stops the first ripple counter by sending a respective hold signal to the first ripple counter to stop the first ripple counter from counting to its reset point.

16. The method of claim 15, wherein the reset points of the first and second ripple counters comprise rollovers of the first and second ripple counters with respective start points set to a column address strobe latency (CL) plus three additional clock cycles.

17. The method of claim 13, comprising synchronizing toggling of first stages of the first and second ripple counters with a system clock of the memory device.

18. A memory device, comprising:
a command interface configured to receive write commands in an even pipeline and an odd pipeline from a host device;
a data strobe (DQS) input buffer configured to buffer a DQS signal from the host device;
a first ripple counter configured to suppress resets of the DQS input buffer while the first ripple counter is counting before reaching a threshold;
a second ripple counter configured to suppress resets of the DQS input buffer while the second ripple counter is counting before reaching the threshold; and
command handling circuitry, comprising:
clock domain shifting circuitry configured to shift commands received in the odd pipeline to a clock domain of the even pipeline;
stop count circuitry configured to stop counting in the first ripple counter or the second ripple counter if a subsequent write command is received before the respective ripple counter has reached the threshold; and
start count circuitry configured to start counting in the first ripple counter or the second ripple counter when a write command is received in the command interface.

19. The memory device of claim 18, wherein the odd pipeline is configured to receive write commands using a first divided clock utilizing odd cycles of a system clock, and the even pipeline is configured to receive write commands using a second divided clock utilizing even cycles of the system clock.

20. The memory device of claim 18, wherein the start count circuitry comprises counter tracking circuitry configured to track whether the first ripple counter or the second ripple counter is to handle a next incoming write command.

21. The memory device of claim 20, wherein the counter tracking circuitry comprises a flip-flop with an input terminal of the flip-flop connected to a complementary output of the flip-flop.

22. The memory device of claim 21, wherein an output of the flip-flop alternates between a first value and a second value with each received write command, the first value corresponds to a launch of the first ripple counter, and the second value corresponds to a launch of the second ripple counter.

23. The memory device of claim 18, wherein the stop count circuitry is configured to generate and transmit a hold signal to the first ripple counter to stop counting in the first ripple counter.

24. The memory device of claim 18, wherein the stop count circuitry is configured to shift a write command of the even pipeline.

* * * * *